US006867451B2

(12) United States Patent
Hieda et al.

(10) Patent No.: US 6,867,451 B2
(45) Date of Patent: Mar. 15, 2005

(54) SEMICONDUCTOR DEVICE AND METHOD FOR MANUFACTURING THE SAME

(75) Inventors: Katsuhiko Hieda, Yokohama (JP); Kazuhiro Eguchi, Chigasaki (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/469,190

(22) Filed: Dec. 21, 1999

(65) Prior Publication Data

US 2002/0153552 A1 Oct. 24, 2002

(30) Foreign Application Priority Data

Dec. 22, 1998 (JP) ............................................ 10-365491
Nov. 26, 1999 (JP) ............................................ 11-336605

(51) Int. Cl.[7] .......................... H01L 29/76; H01L 29/94
(52) U.S. Cl. ....................... 257/306; 257/295; 257/303; 257/310
(58) Field of Search ................................. 257/295, 296, 257/301–312; 438/3, 238, 239, 243, 253, 255

(56) References Cited

U.S. PATENT DOCUMENTS

| 5,567,964 | A | * | 10/1996 | Kashihara et al. | .......... 257/310 |
| 5,635,420 | A | * | 6/1997 | Nishioka | ........................ 438/3 |
| 5,811,333 | A | * | 9/1998 | Zenke | ......................... 438/255 |
| 5,943,547 | A | * | 8/1999 | Yamamichi et al. | ............ 438/3 |
| 6,335,241 | B1 | | 1/2002 | Hieda et al. | ................. 438/253 |
| 6,451,665 | B1 | * | 9/2002 | Yunogami et al. | .......... 438/397 |

OTHER PUBLICATIONS

Yamamichi et al., "An ECR MOCVD (Ba,Sr)TiO$_3$ Based Stacked Capacitor Technology with RuO$_2$/Ru/TiN/TiSi$_x$ Storage Nodes for Gbit-Scale DRAMs," IEDM Technical Digest, pp. 119–112, Dec. 1995.

* cited by examiner

Primary Examiner—Hung Vu
(74) Attorney, Agent, or Firm—Finnegan, Henderson, Farabow, Garrett & Dunner, LLP.

(57) ABSTRACT

A semiconductor device comprises a lower electrode shaped as a convex formed on a semiconductor substrate having crystals, a grain boundary between adjacent crystals being perpendicular to a side of the lower electrode, a capacitor insulating film covering the lower electrode, and an upper electrode formed on the capacitor insulating film.

1 Claim, 15 Drawing Sheets

1 BIT MEMORY CELL REGION

A COLUMNAR CRYSTAL STRUCTURE OF METAL TO BE SN ELECTRODE

SEMICONDUCTOR DEVICE AND METHOD FOR MANUFACTURING THE SAME

BACKGROUND OF THE INVENTION

The present invention relates to a semiconductor device having a capacitor in which a capacitor insulating film and an upper electrode are laminated to cover a convex shaped lower electrode, and also to a method for manufacturing the semiconductor device.

In recent years, as the semiconductor integrated circuit has been highly integrated, the minimum fabricating dimension and the area of a memory cell have become smaller and smaller. Accordingly, the area of the capacitor in a memory has been very small. Although the capacitance (storage capacitance Cs) is reduced in accordance with the reduction in area of the memory cell, it must be greater than a certain value from the viewpoint of the sensitivity, soft error, circuit noise, etc. To solve this problem, two methods have been considered: one is to form a three-dimensional capacitor in order to increase the area of the capacitor as large as possible with a small cell area, thereby increasing the capacitance; and the other is to use an insulating film having a high dielectric constant (so-called highly dielectric material) as the capacitor insulating film.

In a generation of the 0.15 μm or smaller design rule (in the generation of the 512 M bit DRAM or later generations), it is difficult to work a storage node (SN) electrode having a complex three-dimensional form, since a microfabrication process is required. Therefore, to increase the capacitance, it is very important that the capacitor have a three dimensional form and the capacitor insulating film be made of highly dielectric film.

A $(Ba, Sr)TiO_3$ film (hereinafter referred to as a BST film) is a representative of highly dielectric films. Since an oxygen atmosphere is used during formation of the BST film, it has been proposed to use, as a storage node electrode, an Ru film which maintains conductivity even after oxidized in the process of forming the BST film (an $RuO_2$ film has conductivity), or an $RuO_2/Ru$ laminated film (1995 IDEM Technical Digest, S. Yamamichi et al., pp. 119–122).

A structure of a stack-type DRAM capacitor in which a storage node electrode is made of an $RuO_2/Ru$ laminated film will be described with reference to FIG. 15. First, an element isolating region 12 is formed on a p-type Si substrate 11. Thereafter, a gate oxidized film 13 of a transistor, a gate electrode 14 which serves as a word line in a memory cell region, a gate cap layer 15, a source/drain region 16 and a silicon nitride film 17 are formed. After a first interlayer insulating film 191 is deposited and flattened, polysilicon plugs 20a and 20b are buried in a storage node electrode contact region and a bit line contact region, and then a bit line 26 is formed via a second interlayer insulating film 192. Subsequently, after a third interlayer insulating film 193 is deposited and flattened, an SN contact hole is opened and an n⁻-type polysilicon plug 194 is buried therein. Then, a film of a storage node electrode forming material is formed, and thereafter patterned by means of the conventional lithography and RIE using a resist film. As a result, a storage node electrode 27 is formed. After the resist film is removed, a capacitor insulating film 29 made of highly dielectric material, such as a BST film, is formed on the storage node electrode 27. Further, a plate electrode 30 is formed on the capacitor insulating film 29.

Since the storage node electrode is formed by etching the electrode forming material by the RIE, the side surface of the storage node electrode is damaged and in a bad surface condition. The BST film grows, succeeding to the crystal conditions of the storage node electrode on which the BST film is based. Therefore, the damage to the storage node electrode influences the growth of the crystal of the BST film, causing reduction in dielectric constant of the BST film, or results in distortion of the crystal of BST and increase in leak current of the BST film. Thus, the damage to the storage node electrode is a factor in limiting the decrease in thickness of the BST film.

Further, since the storage node electrode grows from the surface of the interlayer insulating films, it has a columnar crystal structure mainly along the vertical direction. Therefore, on the side surface of the storage node electrode constituting a main capacitor, the orientation of the crystal of the storage node electrode is mainly perpendicular to the BST film.

In addition, the storage node electrode structure described above has a problem that upper corners of the storage node electrode become acute and the electric field is concentrated in those portions, resulting in that a very large leak current is generated in the capacitor insulating film.

FIG. 16 shows an $SrRuO_3$ electrode (storage node electrode) 202 formed over a convex shaped TEOS film 201 projecting on a Si substrate 11. The orientation of the crystal of a BST film (capacitor insulating film) 203 greatly varies in corner portions of the electrode 202. Therefore, the crystal is distorted in the portions, with the result that a very large leak current is generated in the capacitor insulating film. This is a restricting factor that hinders reduction in thickness of the capacitor insulating film.

BRIEF SUMMARY OF THE INVENTION

As described above, due to the bad condition of the surface of the storage capacitor, the following problems arise. First, distortion of the crystal of the capacitor insulating film causes a very large leak current in the capacitor insulating film. This problem is a restricting factor that hinders reduction in thickness of the capacitor insulating film.

Secondly, in a stack-type capacitor, electric fields are concentrated in corner portions of the lower electrode, thereby increasing a leak current.

Thirdly, since the orientation of the crystal of the capacitor insulating film greatly varies in the corner portion of the lower electrode, the crystal is distorted. Therefore, the reduction in thickness of the capacitor insulating film is suppressed, thereby inhibiting the capacitance from increasing.

An object of the present invention is to provide a semiconductor device and a method for manufacturing the same, in which the crystallinity and the orientation of the crystal of the BST capacitor insulating film on the side of an Storage node electrode are stably controlled, so that the dielectric constant of the capacitor insulating film can be improved, and the leak current of the capacitor insulating film on the side surface of the storage node electrode, which tends to be thinner than that on the upper surface of the storage node electrode, can be reduced.

Another object of the present invention is to provide a semiconductor device and a method for manufacturing the same, in which the concentration of the electric fields in corner portions of a lower electrode and the variation in orientation of the capacitor insulating film are suppressed, so that the capacitance can be increased.

A semiconductor device of the present invention comprises: a lower electrode shaped as a convex formed on a semiconductor substrate, the lower electrode having crystals, a grain boundary between adjacent crystals being perpendicular to a side of the lower electrode; a capacitor insulating film covering the lower electrode; and an upper electrode formed on the capacitor insulating film.

The following are preferable embodiments of the above semiconductor device.

(a) The crystals, with the grain boundary between adjacent crystals being perpendicular to a side of the lower electrode, constitute the side of the lower electrode.

(b) At least part of the grain boundary on the side of the lower electrode has a direction same as that of a grain boundary of the capacitor insulating film.

(b-1) At least one cap film, made of an insulating material other than the capacitor insulating film, is formed between at least an end portion of a top surface of the lower electrode and the capacitor insulating film.

(b-2) The side of the lower electrode is continuous to a side of the cap film.

(c) A lower end portion of the side of the lower electrode is covered by an insulating film.

(d) The capacitor insulating film formed on a top surface of the lower electrode has a thickness greater than that of the capacitor insulating film formed on the side of the lower electrode.

(e) The lower electrode is used as a memory cell of a stack-type DRAM.

(f) The capacitor insulating film is made of (Ba, Sr) $TiO_3$ or $SrTiO_3$.

A method for manufacturing a semiconductor device of the present invention comprises the steps of: forming on a semiconductor substrate a mask layer having a hole through which a plug electrode is exposed; burying a lower electrode in the hole of the mask layer; forming a capacitor insulating film covering the lower electrode; and forming an upper electrode on the capacitor insulating film.

A semiconductor device of the present invention comprises: a semiconductor substrate; a conductive plug formed on the semiconductor substrate; a lower electrode formed in contact with the conductive plug and constituted by a plurality of crystal grains; a capacitor insulating film formed on a side of the capacitor lower electrode; and a upper electrode formed above the lower electrode via the capacitor dielectric film, a grain boundary between adjacent two of the plurality of crystal grains constituting the lower electrode being substantially perpendicular to an interface between the lower electrode and the capacitor insulating film.

A semiconductor device of the present invention comprises: a semiconductor substrate; a conductive plug formed on the semiconductor substrate; a lower electrode formed in contact with the conductive plug; a capacitor insulating film formed on a side of the lower electrode; and a upper electrode formed above the lower electrode via the capacitor insulating film, the capacitor insulating film being formed above a top surface of the lower electrode via a second insulating film different from the capacitor insulating film.

The following are preferable embodiments of the above method for manufacturing a semiconductor device.

(a) The mask layer is removed, before the capacitor insulating film is formed.

(a-1) Before the mask layer is removed, a surface portion of the lower electrode is removed to form a concave, and a cap film made of an insulating material is formed in the recess.

With the above structure, the present invention provides the following effect and advantage. Since the crystallinity of the capacitor insulating film (BST film) on the side surface of the storage node electrode is increased, the dielectric constant of the capacitor insulating film can be stable, so that the capacitance can be improved stably.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

[First Embodiment]

Figure 1A:
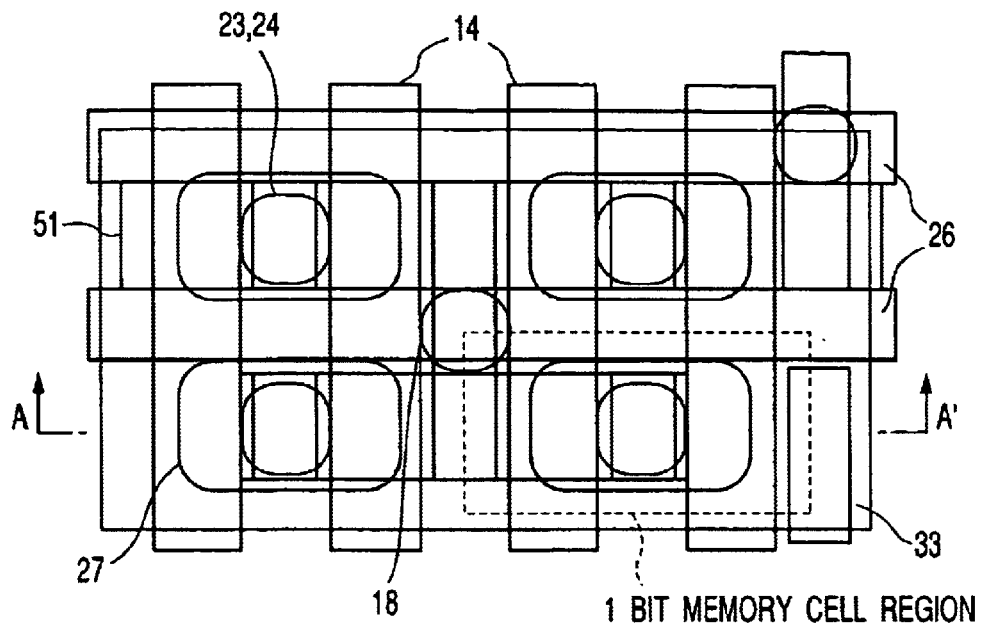
FIGS. 1A and 1B are schematic diagrams showing a memory cell of a stack-type DRAM according to a first embodiment of the present invention.
Figure 1B:
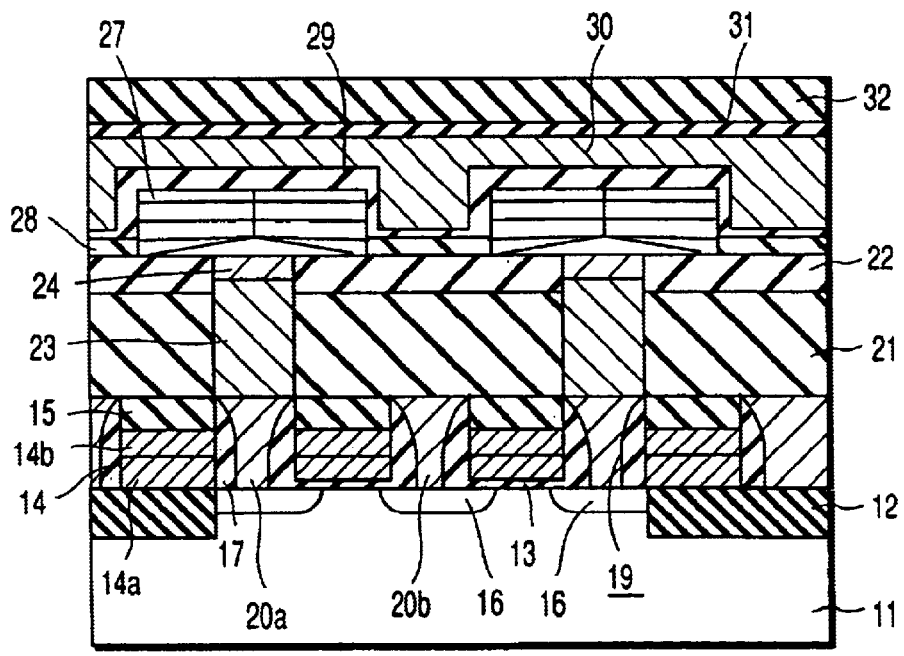

FIGS. 1A and 1B are schematic diagrams showing a memory cell of a stack-type DRAM according to a first embodiment of the present invention. FIG. 1A is a plan view of the DRAM, and FIG. 1B is a cross-sectional view taken along the line A–A' in FIG. 1A.

As shown in FIGS. 1A and 1B, an insulating film is buried in, for example, a p-type Si substrate 11, thereby forming an element isolating region 12. A gate electrode (word line) 14 is formed on the element isolating region or a gate oxide film 13 on the Si substrate 11. The gate electrode 14 is formed of a polysilicon film 14a and a $WSi_2$ film 14b laminated thereon. In this embodiment, to reduce the resistance, the gate electrode has a multilayer film of a so-called polycide (polysilicon silicide) structure. However, it may have another structure; for example, a simple polysilicon layer or a laminated structure made of a polysilicon layer and a W film.

A gate cap layer 15 made of a silicon nitride film is formed on the gate electrode 14. In a surface portion of the element region of the Si substrate 11, source/drain diffusion layers 16 are formed so as to sandwich the gate electrode 14. A silicon nitride film 17 is formed on the side of the laminated structure constituted by the gate electrode 14 and the gate cap layer 15. A contact hole 19 is defined by the adjacent silicon nitride films 17 and a first BPSG film (not shown). A polysilicon contact 20 (an SN contact 20a, a BL contact 20b) is buried in the contact hole 19. The surfaces of the gate cap layer 15, the polysilicon contact 20 and the first BPSG film (not shown) are flattened at the same level.

A second BPSG film 21 and a TEOS oxide film 22, serving as second and third interlayer insulating films, are successively formed on the overall surface. A bit line 26 is formed in a trench formed in the second BPSG film 21 and the TEOS oxide film 22. The bit line is connected to the BL contact 20b via a BL contact plug 25. In the following description, the laminated structure of the second BPSG film 21 and the TEOS oxide film 22 is referred to as interlayer insulating films 21 and 22.

A W plug 23 and a barrier metal layer 24 are formed in an SN contact hole in the interlayer insulating films 21 and 22 and connected to the SN contact 20a. The surfaces of the barrier metal layer 24 and the TEOS oxide film 22 are at substantially the same level.

A storage node electrode (lower electrode) 27 made of $SrRuO_3$ is connected to the W plug 23 via the barrier metal layer 24 on the TEOS oxide film 22. The grain boundary between the adjacent crystals of $SrRuO_3$ on a side of the storage node electrode 27 is perpendicular to the side of the storage node electrode 27.

A silicon nitride film 28 is formed on a portion of the TEOS oxide film 22 on which the storage node electrode 27 is formed. A (Ba, Sr)TiO3 [BST] film 29 is formed to cover the surfaces of the storage node electrode 27 and the silicon nitride film 28.

A method for manufacturing a DRAM memory cell having the aforementioned storage node structure will now be described.

FIGS. 2A to 2L are plan views showing a method for manufacturing the memory cell of the DRAM of the first embodiment, and FIGS. 3A to 3L are cross-sectional views taken along the lines A–A' to L–L' in FIGS. 2A to 2L. The following description relates to a case in which an N-channel MOS transistor is used as a memory cell. However, the same applies to a case of a P-channel MOS transistor.

Figure 2A:
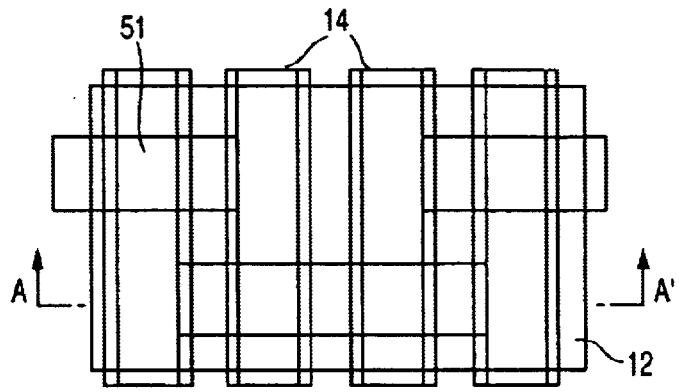
FIGS. 2A to 2L are plan views showing a method for manufacturing the memory cell of the DRAM shown in FIGS. 1A and 1B.
Figure 3A:
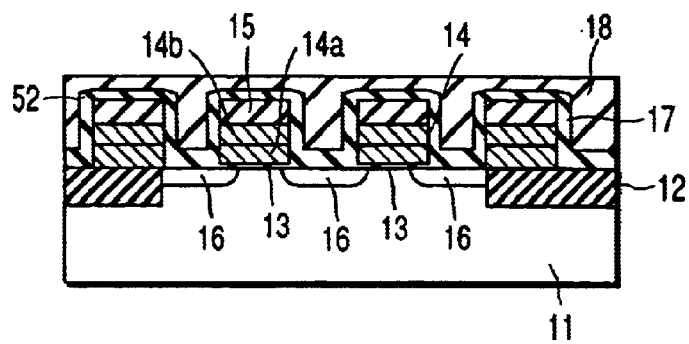
FIGS. 3A to 3L are cross-sectional views taken along the lines A–A' to L–L' in FIGS. 2A to 2L.

As shown in FIGS. 2A and 3A, a p-well and an n-well (not shown) are respectively formed in an n-channel transistor forming region and a p-channel is transistor forming region of the p-type silicon substrate 11 or an n-type silicon substrate of the (100) plane, doped with impurities in a concentration of about $5\times10^{15}$ $cm^{-3}$. Subsequently, a trench having a depth of about 0.2 μm is formed in a region of the Si substrate 11 other than the element region 51 by, for example, reactive ion etching (RIE). The trench is filled with insulating film, thereby forming the element isolating region 12 using a so-called ITS (Shallow Trench Isolation) technique.

Then, the gate oxide film 13 having a thickness of about 60 nm is formed as a gate insulating film of the transistor. The polysilicon film 14a and the $WSi_2$ film 14b, each having a thickness of about 50 nm, are successively formed on the gate oxide film 13.

Thereafter, the gate cap layer 15 made of silicon nitride film ($Si_3N_4$ film) is formed on the $WSi_2$ film 14b. This layer serves as an etching stopper layer in a self-aligning step later. Subsequently, a resist film (not shown) is formed in a gate electrode forming region on the gate cap layer 15. Using the resist film as a mask, the gate cap layer 15 is processed to remove the resist film. Using the gate cap layer 15 as a mask, the polysilicon film 14a and the $WSi_2$ film 14b are patterned, thereby forming the gate electrode 14, which serves as a word line in the memory cell portion.

The gate electrode 14 of this embodiment has a so-called polycide structure made of a multilayer film of the polysilicon film 14a and the $WSi_2$ film 14b to reduce the resistance. However, it may have another structure; for example, a simple polysilicon layer or a laminated structure made of a polysilicon layer and a W film.

Thereafter, a so-called post-oxidation film (not shown) is formed on the surface of the Si substrate 11 through the RTO (Rapid Thermal Oxidation) method in, for example, oxygen atmosphere at 1050° C. for about 100 seconds, in order to improve the withstand voltage between the gate electrode 14 and impurity diffusion layers (source/drain diffusion layers) in a low concentration formed later.

After forming a resist film, n—type impurity diffusion layers, serving as source/drain diffusion layers 16 later, are formed on the surfaces of desired regions in the Si substrate 11 by, for example, ion implantation. At this time, the resist film, the gate cap layer 15 and the gate electrode 14 serve as a mask.

Subsequently, a silicon nitride film ($Si_3N_4$ film) 17 of a thickness of about 20 nm is deposited on the overall surface by the LP-CVD method. Thereafter, a first BPSG film 18 is deposited on the overall surface to a thickness of about 500 nm by the CVD (Chemical-Vapor Deposition) method. Then, the overall surface of the first BPSG film 18 is polished and flattened by, for example, the CMP (Chemical Mechanical Polish), so that the thickness of the first BPSG film 18 on the gate cap layer 15 is about 100 nm. The flattening of the first BPSG film 18 by the CMP method entirely flattens the overall surface of the wafer.

Although an explanation was omitted, source/drain diffusion layers made of $n^+$ (or $p^+$)-impurity diffusion layers can be formed as follows. Before the silicon nitride film 17 is formed, a silicon nitride film ($Si_3N_4$ film) of a thickness of about 20 nm is deposited on the overall surface by the LP-CVD method. The silicon nitride film is etched by the RIE method, thereby forming side insulating films on side walls of the gate electrode. Thereafter, impurities are implanted into desired regions by the ion implantation method using the resist film, the side insulating films, and the gate electrode as a mask. As a result, source/drain regions made of $n^+$ (or $p^+$)-impurity diffusion layers are formed. In this case, a silicon nitride film ($Si_3N_4$ film) of a thickness of about 20 nm is deposited again on the overall surface by the LP-CVD method. It serves as a stopper film when CMP is performed later.

Figure 2B:
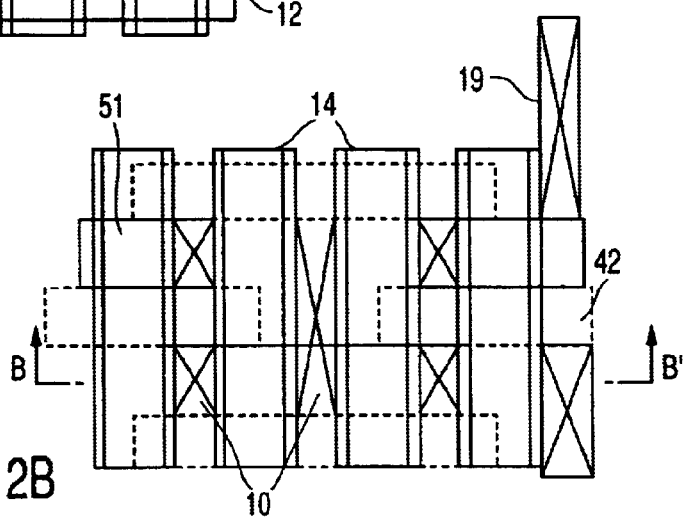
Figure 3B:
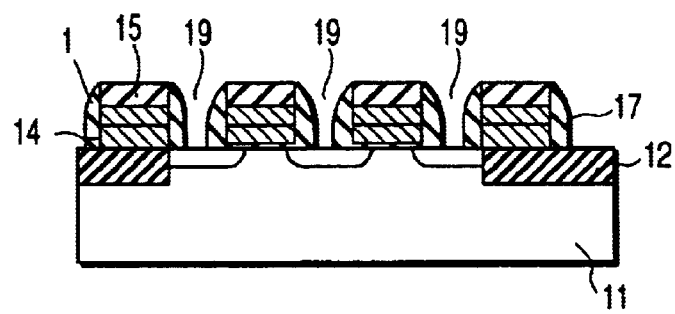

As shown in FIGS. 2B and 3B, contact holes 19 for polysilicon plugs are formed to contact the source/drain diffusion layers 16 and the bit lines or the storage node electrodes. At this time, a resist film 42 formed on the first BPSG film 18 by lithography serves as a mask. The contact holes 19 are formed by a self-aligning method by a high selection rate RIE in which the etching rate of the BPSG film is at least 10 times higher than that of the silicon nitride film. This method prevents a short circuit between the gate electrode 14 and $n^+$-type polysilicon contacts (19a, 19b) buried in the contact holes 19 later. As a result, the production yield can be improved.

The resist film 42 does not have a hole pattern. For example, the silicon nitride film 17 on the gate electrode 14 and a rectangular pattern are used to form desired contact holes 19. In this method, the contact holes formed by means of the resist film having a hole pattern are not circular but rectangular. Therefore, this method is advantageous in that the contact holes 19 have a large open area.

Figure 2C:
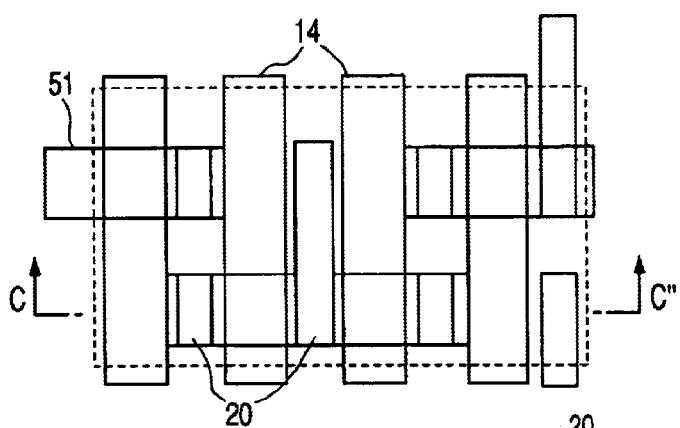
Figure 3C:
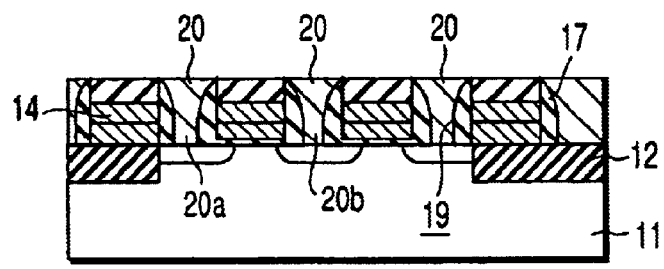

Then, as shown in FIGS. 2C and 3C, after the resist film 42 is removed, an $n^+$-type polysilicon layer doped with impurities such as phosphorous ($P^+$) or arsenic ($As^+$) ions is deposited by the LP-CVD method on the overall surface. Thereafter, $n^+$-type polysilicon is completely buried in the contact holes by an etch-back method using the CMP or RIE method, thereby forming $n^+$-type polysilicon contacts 20 (an SN contact 20a and a BL contact 20b). The buried $n^+$-type polysilicon contacts 20 are electrically connected to the source/drain diffusion layers 16.

Figure 2D:
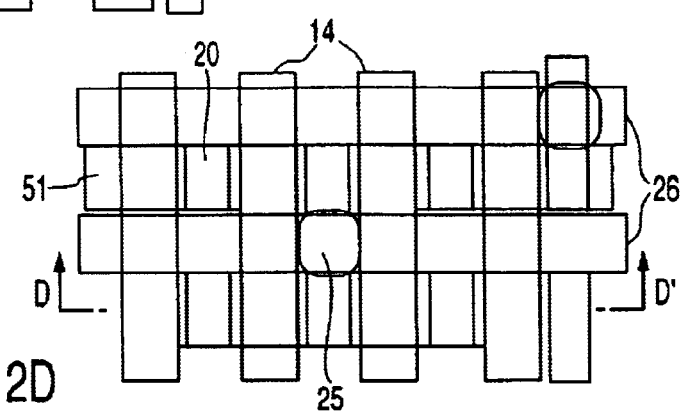
Figure 3D:
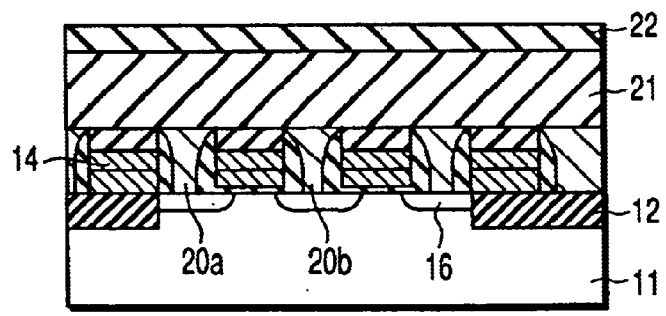

Subsequently, as shown in FIGS. 2D and 3D, a second BPSG film 21 is deposited on the overall surface to a thickness of about, for example, 300 nm, by the CVD method. A TEOS oxide film 22, serving as a stopper layer in the CMP process, is deposited on the second BPSG film 21 to a thickness of about 300 nm by the CVD method. Line trenches of a depth of about 350 nm are formed in the interlayer insulating films 21 and 22. Thereafter, a BL contact hole connected to the BL contact 20b is opened by the conventional lithography and RIE methods. A laminated film of, for example, a W/TiN/Ti film, is buried in the line trenches of the depth of about 350 nm formed in the interlayer insulating films 21 and 22 and the BL contact hole through a dual damascene process using the CMP method. As a result, a BL contact plug 25 buried in the BL contact hole and bit lines 26 electrically connected to the BL contact 20b via the BL contact plug 25 are formed.

Further, the surfaces of the bit lines buried in the trenches are etched by, for example, about 100 nm. Then, a silicon nitride film is deposited on the overall surface, and subjected to the CMP method, the CDE (Chemical Dry Etching) or the like, so that a silicon nitride film is selectively formed only on the surface of the bit lines 26.

Before the bit lines 26 are formed, trenches for forming contact holes and bit lines in the memory cell portion are also formed by the conventional lithography and RIE methods in a contact region of a peripheral circuit portion. With this method, when the bit lines are formed by the dual damascene process, source/drain diffusion layers and contact plugs electrically connected thereto are simultaneously formed in the peripheral circuit portion.

Figure 2E:
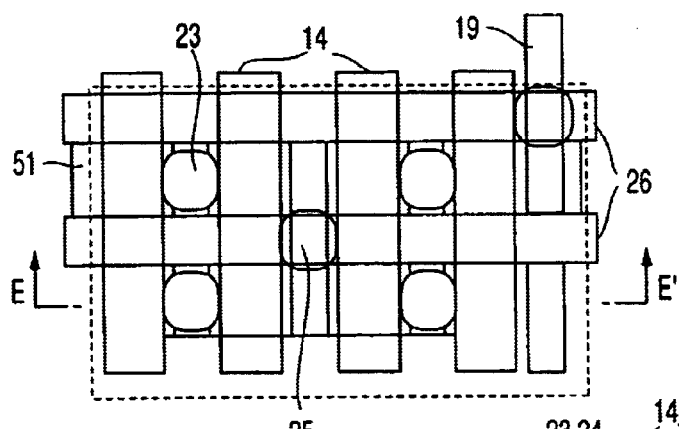
Figure 3E:
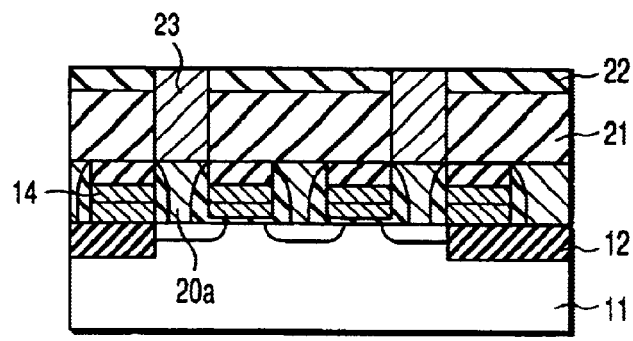

Subsequently, as shown in FIGS. 2E and 3E, contact holes connected to the SN contacts 20a are opened in the interlayer insulating films 21 and 22 by the conventional lithography and RIE methods. A laminated film of, for example, a W/TiN/Ti film, is deposited on the overall surface. Then, the laminated film on the TEOS oxide film 22 is removed by the CMP method, or the like, and W plugs 23 for SN metal plugs are buried only in the contact holes. The W plugs 23 are connected to the source/drain diffusion layers 16 via the $n^+$-type SN contact 20a. To form the contact holes, desired fine contact holes are formed in very small regions between the bit lines using the silicon nitride films and the resist films on the bit lines 26 as a mask. At this stage, both the memory cell portion and the peripheral circuit portion are flat.

Figure 2F:
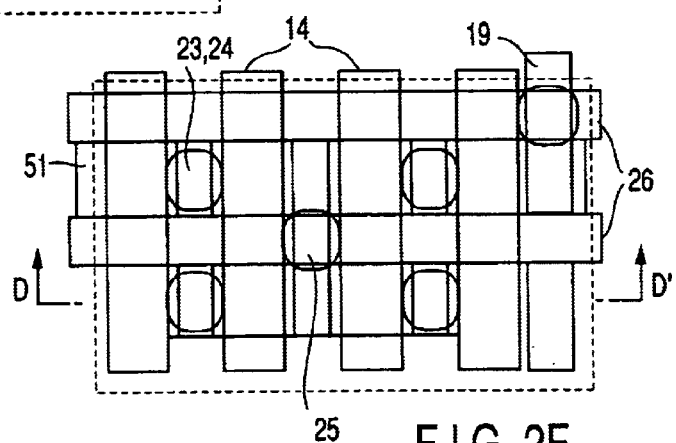
Figure 3F:
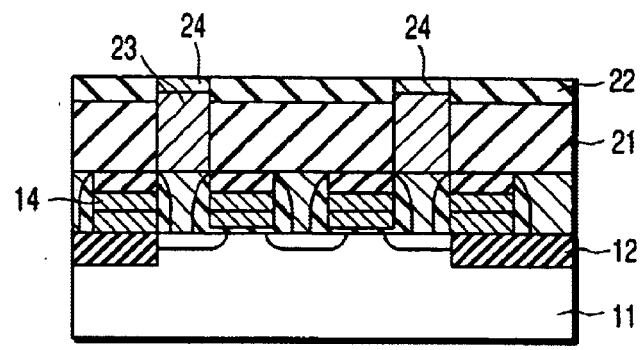

Then, as shown in FIGS. 2F and 3F, the exposed W plugs 23 are etched back (recessed) by about 30 nm by the CDE method, thereby forming recesses. Thereafter, barrier metal layer 24 (TiN, TiSiN, TiAlN, TaSiN, $WSi_2$ or TiCN film) are formed by sputtering. The surface is polished by the CMP method or the like, with the result that the barrier metal layer 24 is selectively buried in the recesses obtained by removing parts of the W plugs.

Figure 2G:
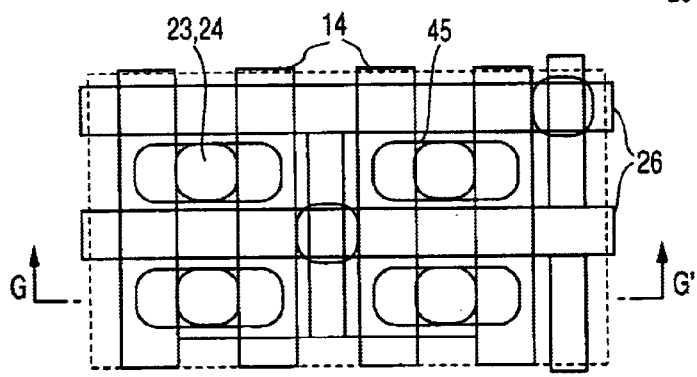
Figure 3G:
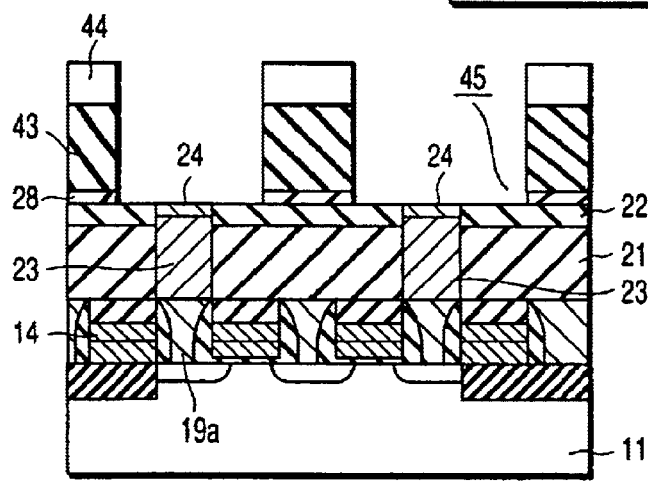

Subsequently, as shown in FIGS. 2G and 3G, an about 20 nm thick silicon nitride film ($Si_3N_4$ film) 28 and an about 400 nm thick mask layer 43 made of, for example, a TEOS oxide film, are deposited on the overall surface. Thereafter, a resist film 44 having holes in storage node electrode forming regions is formed. The mask layer 43 and the silicon nitride film 28 are etched by the RIE method using the resist film 44 as a mask, thereby forming holes 45 through which the barrier metal layer 24 is exposed. At this time, it should be noted that the mask layer 43 and the silicon nitride film 28 are etched at an angle of substantially 90°.

When the holes 45 are formed, it is preferable that the mask layer 43 is etched by the RIE method using the silicon nitride film 28 as a stopper layer and then the etching conditions are changed to selectively etch the silicon nitride film 28. In this case, the holes 45 of the storage electrode pattern can be formed without overetching the TEOS oxide film 22. At this time, a region which should not be etched, such as the peripheral circuit region, cannot be etched, if it is covered by the resist film 44. Further, to protect the silicon nitride film on the bit line 26 from being etched simultaneously with the silicon nitride film 28, an oxide film may be formed under the silicon nitride film 28.

Figure 2H:
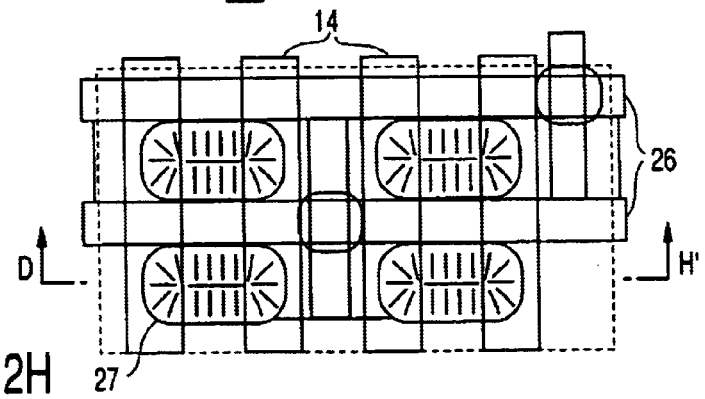
Figure 3H:
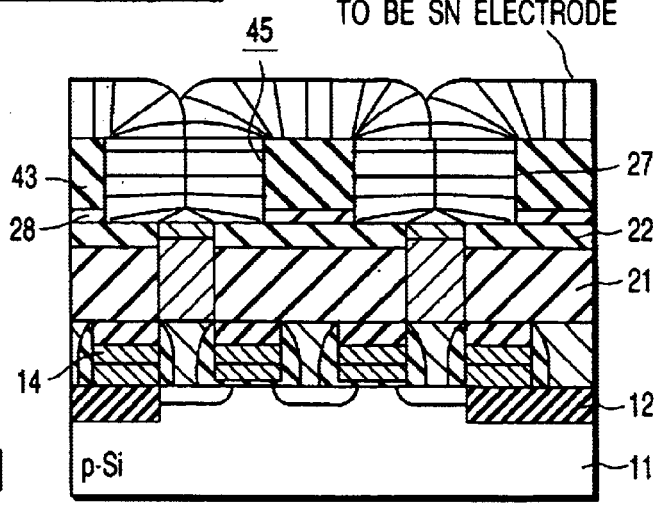

Subsequently, as shown in FIGS. 2H and 3H, after the resist film 44 is removed, a metal oxide film having a perovskite crystal structure, $SrRuO_3$ film (storage node electrode material 27) is deposited on the overall surface including the surface of the barrier metal layer 24 at the bottoms of the exposed holes 45 by, for example, the CVD method or sputtering to a thickness of about 400 nm.

At this time, the crystal structure of the storage node electrode material 27 must be controlled. It is important that the main crystal of the storage node electrode 27 have an angle of substantially 90° with respect to the direction of the columnar crystal in a region which contacts to the silicon nitride film 28 and the mask layer 43. Further, at this time, since the storage node electrode material is buried in trench portions, the memory cell region and the peripheral circuit region are formed without a difference in level therebetween.

In this embodiment, SrRuO$_3$ film is used as the storage node electrode material. However, the storage node electrode material may be Ru, RuO$_2$, Pt, Re, Os, Pd, Rh, Au, Ir or IrO$_2$ film. Alternatively, it may be made of a film obtained by stuffing grains of a metal film with another metal film, for example, Rh or Ir.

Figure 2I:
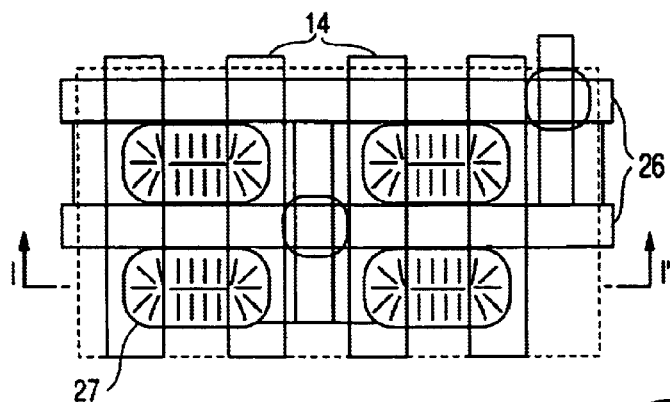
Figure 3I:
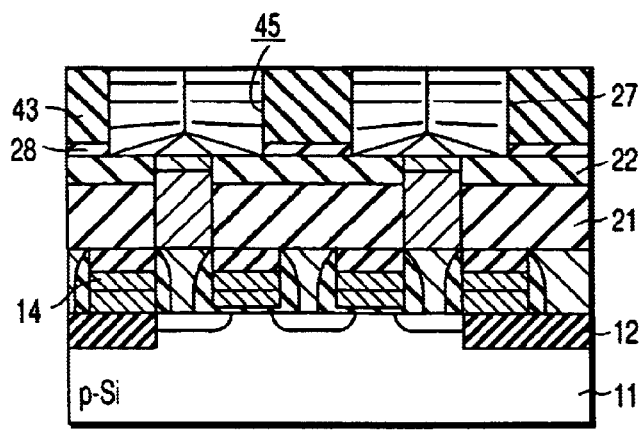

Subsequently, as shown in FIGS. 2I and 3I, the storage node electrode material 27 on the mask layer 43 is removed by the CMP or etch-back method. As a result, the storage node electrodes 27 buried in the holes 45 are formed.

After the storage node electrode material 27 on the mask layer 43 is removed, the mask layer 43 and the storage node electrode 27 may be polished or etched under conditions in which they are etched at the same rate. In this case, although the level of the storage node electrode 27 is lowered by removing the surface portion of the storage node electrode 27, the crystal structures on the side of the storage node electrode 27 are aligned.

Figure 2J:
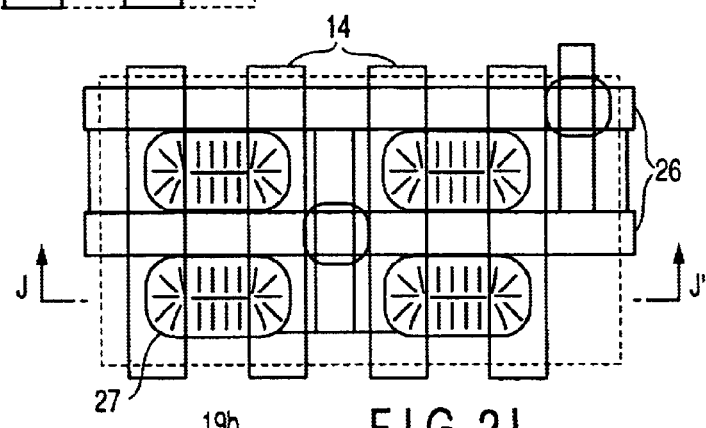
Figure 3J:
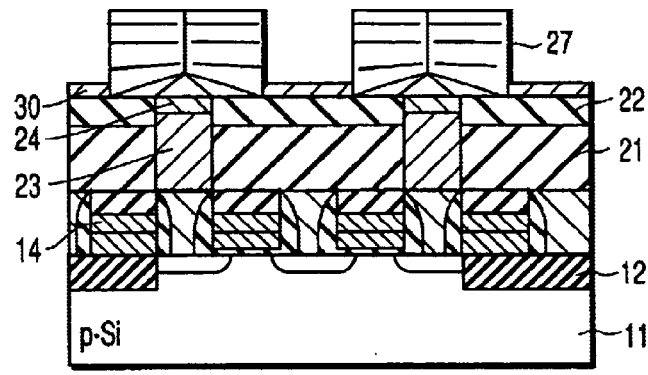

Subsequently, as shown in FIGS. 2J and 3J, a region of the mask layer 43 which should not be removed, for example, the peripheral circuit region, is covered by a resist film, and the mask layer 43 is selectively removed by wet etching solution, for example, NH$_4$F solution. At this time, the wet etching is stopped by the silicon nitride film 28 formed under the insulating film.

Further, the columnar crystal structure is arranged in the horizontal direction on the side of the storage node electrode 27. A crystal plane on the top surface of the storage node electrode is different from that of the side thereof. However, since the BST film formed in this region in the subsequent step tends to be thicker than that on the side of the storage node electrode, the problem of a leak current or the like does not occur.

The side surface of the hole formed by etching the silicon nitride film 28 and the mask layer 43 is transferred to the side surface of the storage node electrode 27. Therefore, the storage node electrode 27 having a smooth side is realized.

More specifically, the side of the conventional storage node electrode is formed by etching a metal electrode or the like, which is difficult to process. However, according to this embodiment, the etching surface of an oxide film, which is comparatively smooth, is transferred to the side of the storage node electrode.

The smooth side of the storage node electrode suppresses the increase in leak current in the capacitor insulating film caused by the electric field concentration due to roughness of the side of the storage node electrode. In addition, since the silicon nitride film 28 is present in the bottom side portion of the storage node electrode 27, it prevents an influence of the bottom corner on the storage node electrode.

If a region of the mask layer 43 which should not be removed, for example, the peripheral circuit region, is covered by a resist film (not shown), the surface of the storage node electrode 27 in the memory cell region and the surface of the mask layer 43 in the region other than the memory cell region are aligned at the same level. Thus, the difference in level between the memory cell region and the other region is substantially eliminated, whether the storage node electrode 27 is present or not. In the process of manufacturing a DRAM having a stack structure, a step for reducing the difference in level is very important.

Figure 2K:
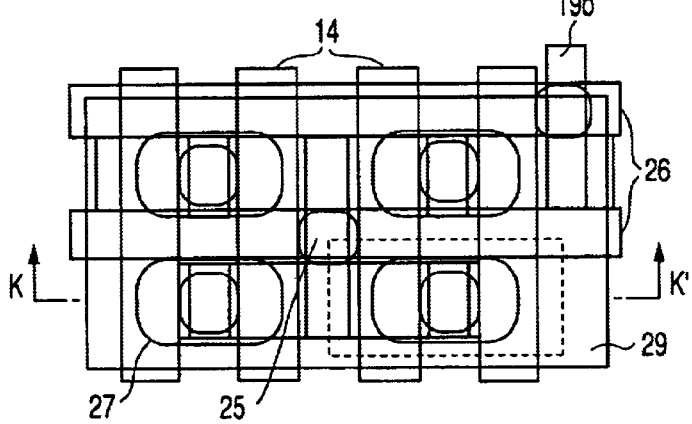
Figure 3K:
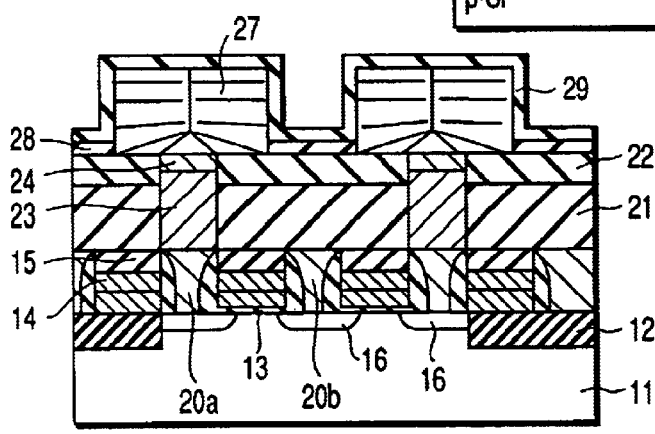

Subsequently, as shown in FIGS. 2K and 3K, a BST film 29 is deposited on the overall surface to a thickness of about 20 nm by, for example, the CVD method. Further, if necessary, the BST film is subjected to annealing for crystallization.

The BST film on the smooth side of the storage node electrode 27 has satisfactory crystallinity and a high dielectric constant. Since the BST film on the top surface of the storage node electrode 27 is rougher than that on the side, the crystallinity of the former is inferior to that of the latter. However, it is better than that of the BST film on the side of the storage node electrode formed by the conventional etching process.

Figure 2L:
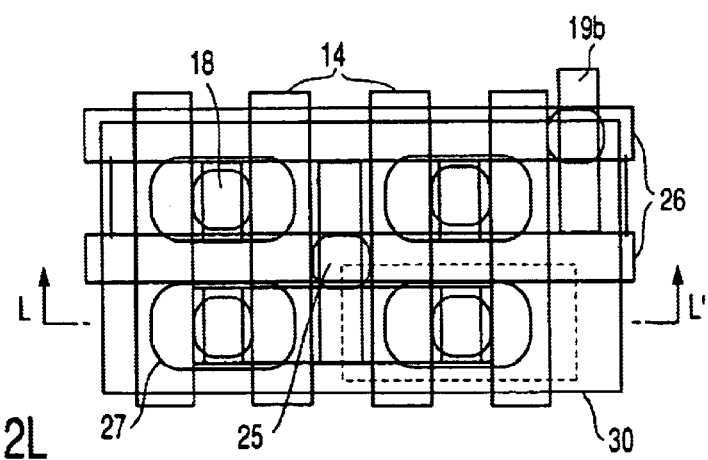
Figure 3L:
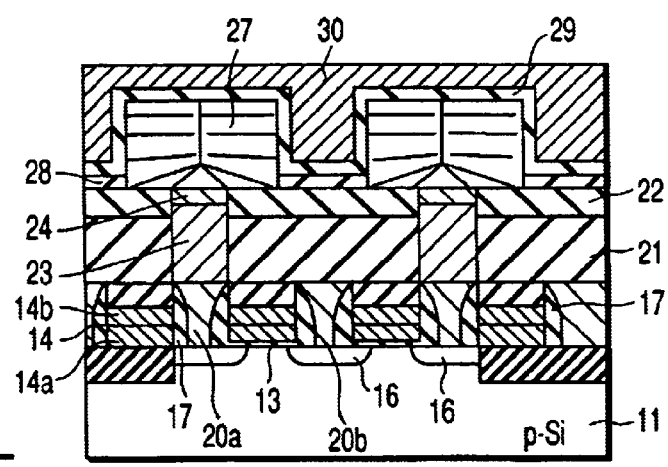

As shown in FIGS. 2L and 3L, for example, an SrRuO$_3$ film, for forming a plate electrode (upper electrode) 30 of the capacitor, is deposited on the overall surface to a thickness of about 40 nm by, for example, the CVD method. Thereafter, the plate electrode 30 is patterned by the conventional lithography, the RIE method, etc. (not shown).

At this time, a difference in level occurs between the memory cell region and the other region including no plate electrode, such as the peripheral circuit region. The plate electrode may be made of a film other than the SrRuO$_3$ film: for example, a conductive film of a precious metal, such as Ru, Pt, Re, Ir, Os, Pd, Rh and Au, an oxide film of the metal, or a perovskite conductive metal oxide film other than the SrRuO$_3$ film. Further, an interlayer insulating film (not shown) such as a plasma TEOS oxide film is deposited on the overall surface to a thickness of about 400 nm, so that the overall surface is flattened again by the CMP method. As a result, the difference in level between the memory cell region and the peripheral circuit region is eliminated.

Subsequently, although not shown in the drawings, a contact hole is opened in a desired region and a metal wire is formed. If necessary, a plurality of contact layers and a plurality of metal wiring layers may be formed. Then, a passivation film is formed and a pad contact is opened, thus completing a DRAM.

In this embodiment, the TiN film or the like is used as the barrier metal layer between the W plug 23 and the storage node electrode 27. However, it is important that a conductive film be buried in part of the trench of the W plug 23. The conductive film may be made of a laminated film such as a TiN/Ti film, a metal film such as WSi$_2$ film, Nb film and Ti film, and a compound, for example, a silicide film of the aforementioned metal or a nitride film thereof (e.g., a WN film). The characteristics required for the barrier metal material are a reaction barrier characteristic between the metal plug material (for example, W film or TiN film) and the storage node electrode material (SrRuO$_3$ film or Ru film), and an oxidation resistance characteristic. Any material other than those indicated above can be used as a barrier metal layer forming material, so long as it has the above characteristics.

According to this embodiment, since the side surface of the storage node electrode is smooth, the crystallinity of the BST film which grows on the side surface is improved. Therefore, distortion in a BST crystal is suppressed. The increase in crystallinity of the BST film suppresses the leak current of the capacitor and stabilizes the dielectric constant of the BST film, with the result that the capacitance is increased.

The crystallinity of the capacitor insulating film on the top of the storage node electrode is inferior to that on the side of the storage node electrode. However, since the ratio of the area of the top to that of the side is as low as 15%, the capacitance can be increased by increasing the dielectric constant of the BST film on the side. In addition, when a film is formed by the CVD method, since the film on the top of a convex portion is thicker than that on the side thereof, the leak current is prevented from increasing. Therefore, the deteriorated influence on the top of the storage node electrode can be suppressed.

Moreover, the silicon nitride film 28 is formed in the bottom side portion of the storage node electrode, where the crystal orientation of the metal film is disordered, so that the portion cannot be used as a capacitor. Therefore, the uniformity of the characteristics (leak current, relative dielectric constant, etc.) of the BST film on the side of the storage node electrode is improved, there by increasing the yield of the DRAM elements.

The advantage of the present invention is obtained in a film wherein a crystal structure is used as a capacitor insulating film. Therefore, the present invention is also effective in the case of a capacitor insulating film made of a $Ta_2O_5$ film or an $SrTiO_3$ film which have a crystal structure.

[Second Embodiment]

Figure 4:
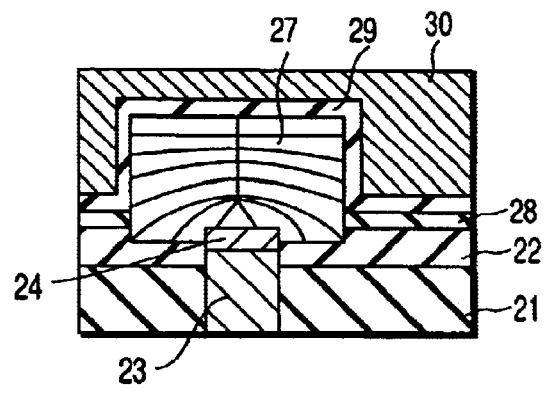
FIG. 4 is a schematic cross-sectional view showing a structure including a storage node electrode of a memory cell of a stack-type DRAM according to a second embodiment of the present invention.

FIG. 4 is a schematic cross-sectional view showing a structure including a storage node electrode of a memory cell of a stack-type DRAM according to a second embodiment of the present invention. The cross section is taken along a line corresponding to the line A–A' in FIG. 1A.

The second embodiment is different from the first embodiment in shape of the storage node electrode. In the first embodiment, the bottom of the storage node electrode 27 is formed above the TEOS oxide film 22. In the second embodiment, a part of the bottom of the storage node electrode 27 is buried in the TEOS oxide film 22. With this structure, the bottom side portion of the storage node electrode, where the crystal structure is liable to be disordered, is excluded from the capacitor forming portion. Therefore, a more stable BST film can be obtained.

[Third Embodiment]

Figure 5:
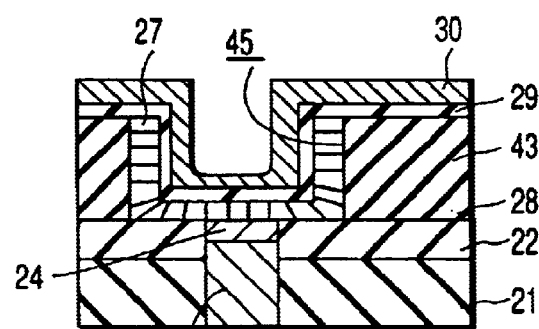
FIG. 5 is a schematic cross-sectional view showing a structure including a storage node electrode of a memory cell of a stack-type DRAM according to a third embodiment of the present invention.

FIG. 5 is a schematic cross-sectional view showing a structure including a storage node electrode of a memory cell of a stack-type DRAM according to a third embodiment of the present invention. The cross section is taken along a line corresponding to the line A–A' in FIG. 1A.

The third embodiment is different from the first and second embodiments in structure of the storage node electrode. In the capacitor of this embodiment, the mask layer 43 remains and the storage node electrode 27 is formed along the inner wall and the bottom of the hole 45 formed in the mask layer 43. The storage node electrode 27 of this structure can be formed by depositing an electrode material to a thickness of about 30 nm on the interior surface of a hole of a size about 0.20 $\mu$m×0.40 $\mu$m.

A method for forming a storage node electrode having the aforementioned concave type structure of this embodiment will be described below. FIGS. 6A to 6E are cross-sectional views showing a process for manufacturing a capacitor of the third embodiment.

Figure 6A:
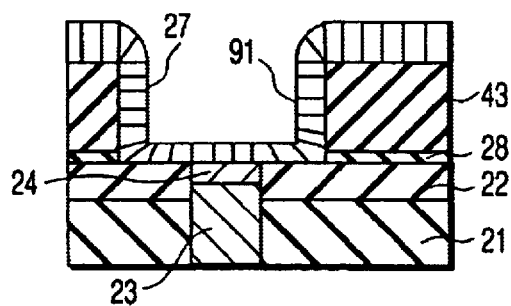
FIGS. 6A to 6E are cross-sectional views showing a process for manufacturing a capacitor according to the third embodiment of the present invention.
Figure 6C:
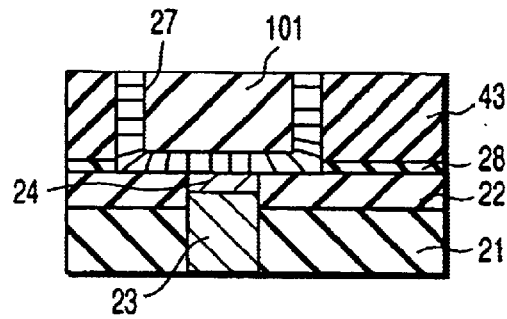
Figure 6B:
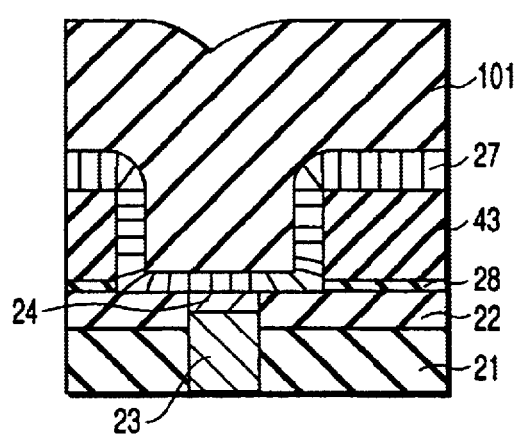

First, as shown in FIG. 6A, a hole for exposing the barrier metal layer is formed in a region of the mask layer 43 in which a storage node electrode is to be formed. A storage node electrode material 27 is deposited to a thickness of about 30 nm on the interior surface of the hole by, for example, the CVD method. At this time, the hole should not be completely filled with the storage node electrode 27. Thereafter, a cap 101 made of SOG film or the like is buried in the hole (FIG. 6B). The cap 101 and the storage node electrode material 27 above the mask layer 43 are etched by the CMP method, so that the cap 101 is formed only inside the hole (FIG. 6C). At this time, the storage node electrode 27 has a side surface on the interior wall of the concave and two horizontal surfaces (a horizontal surface at the same level as the insulating film and a horizontal surface on the bottom of the concave).

Figure 6D:
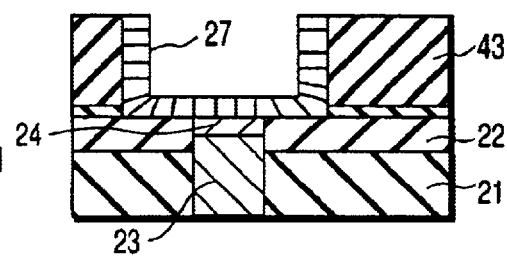
Figure 6E:
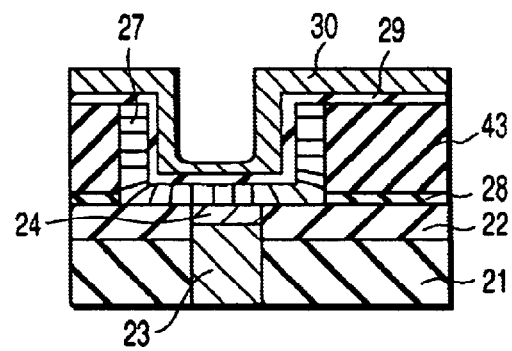

Then, as shown in FIG. 6D, the cap 101 is removed. Thereafter, as shown in FIG. 6E, a BST film 29 and a plate electrode 30 are formed, with the result that a capacitor is completed.

With this structure, the crystal structures of the BST film are aligned on the side and the bottom of the storage node electrode. Thus, the same effect as that of the first embodiment can be obtained. Moreover, since it is unnecessary to remove the mask layer 43, a structure with excellent flatness can be realized.

[Fourth Embodiment]

Figure 7:
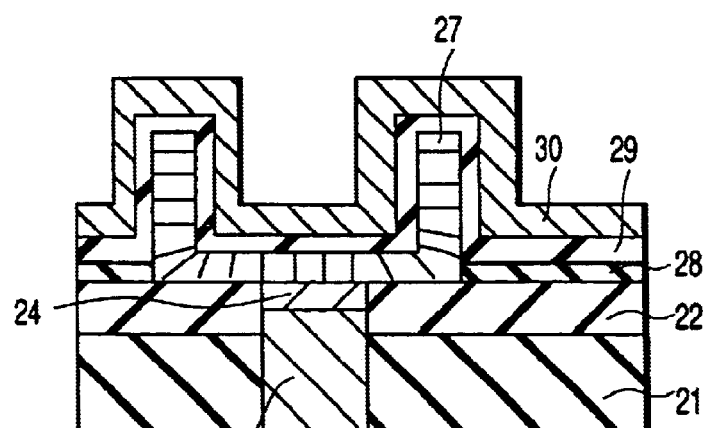
FIG. 7 is a schematic cross-sectional view showing a structure including a storage node electrode of a memory cell of a stack-type DRAM according to a fourth embodiment of the present invention.

FIG. 7 is a schematic cross-sectional view showing a structure including a storage node electrode of a memory cell of a stack-type DRAM according to a fourth embodiment of the present invention. The fourth embodiment is different from the third embodiment in that the mask layer 43 is removed and both sides of the storage node electrode 27 are used; that is, it has a cylindrical structure. Since the crystal structures of the BST film 29 are aligned on both sides and the bottom of the storage node electrode, the same effect as that of the first embodiment can be obtained. In addition, the area of the capacitor forming region can be increased, and the height of the storage node electrode 27 can be reduced.

The structure of the fourth embodiment can be obtained by depositing the BST film 29 after removing the mask layer 43 in the method of manufacturing a semiconductor device of the third embodiment.

[Fifth Embodiment]

Figure 8A:
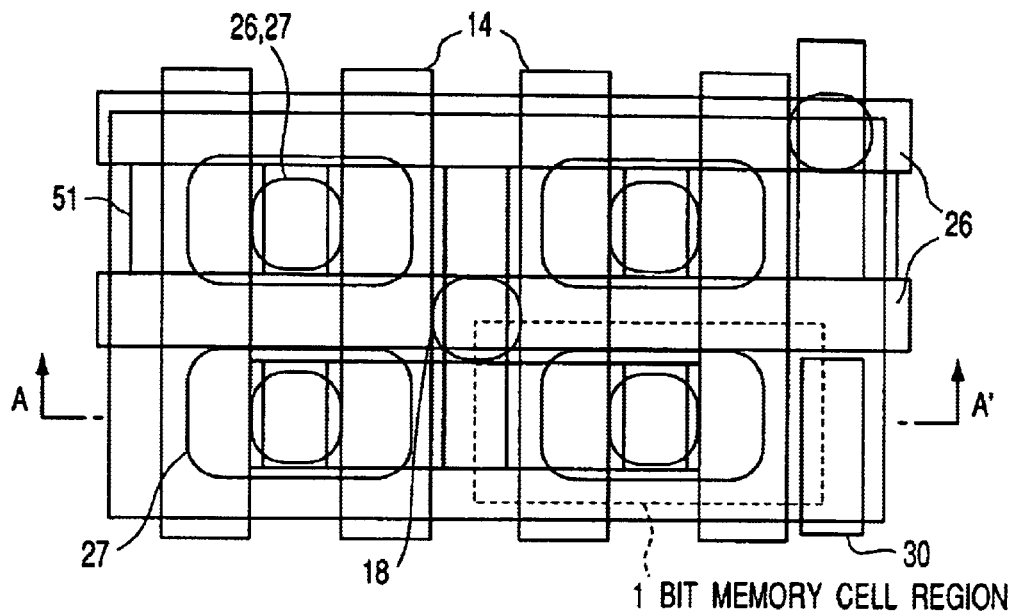
FIGS. 8A and 8B are schematic diagrams showing a memory cell of a stack-type DRAM according to a fifth embodiment of the present invention.
Figure 8B:
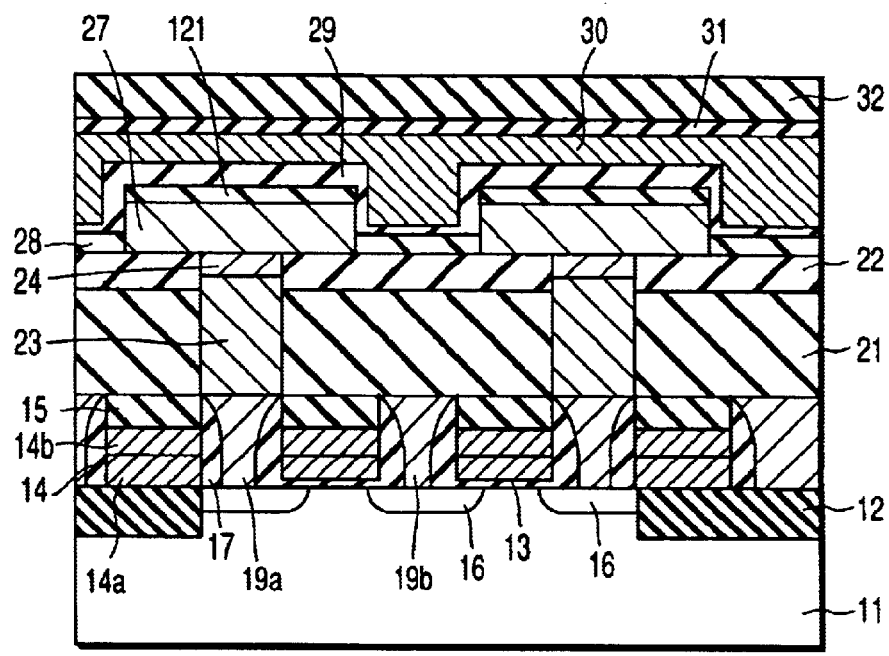

FIGS. 8A and 8B are schematic diagrams showing a memory cell of a stack-type DRAM according to a fifth embodiment of the present invention. FIG. 8A is a plan view of the DRAM, and FIG. BB is a cross-sectional view taken along the line A–A' in FIG. BA. In FIGS. 8A and 8B, the portions the same as those shown in FIGS. 1A and 1B are identified by the same reference numerals, and detailed descriptions thereof are omitted.

A silicon nitride film 28 is formed on that portion of the TEOS oxide film 22 in which the storage node electrode 27 is not formed. The (Ba, Sr)$TiO_3$ (BST) film 29 is formed to cover the storage node electrode 27, the SN cap layer 121 and the silicon nitride film 28. The plate electrode 30 made of $SrRuO_3$ film, whose surface is flattened, is formed on the BST film 29. An interlayer insulating film 32 is formed above the plate electrode 30 via an PL cap film 31.

The capacitor of this embodiment provides the following effects and advantages.

1. Since the side of the storage node electrode 27 and the side of the SN cap film 121 are continuous to each other, concentration of the electric field due to an acute corner formed between the side and the top surface of the storage node electrode is prevented. Therefore, leak current in the capacitor insulating film is reduced.

2. Since the top surface of the storage node electrode is covered by the insulating film, when a capacitor insulating film is formed by the chemical-vapor deposition (CVD), the CVD film cannot be thicker on the top surface of the storage node electrode than on the side thereof. Therefore, coverage of the capacitor insulating film (the uniformity in thickness of the film on the side of the storage node electrode) is improved, so that the capacitor insulating film can be thinner. Thus, the capacitance can be increased.

3. Since the orientation of the BST film is not varied but uniform on the side of the storage node electrode, the uniformity in characteristics (leak current, relative dielectric constant, etc.) of the capacitor insulating film on that portion is improved. As a result, the yield of the DRAM elements is improved.

A process for producing the DRAM memory cell having the storage node electrode structure shown in FIGS. 8A and 8B will now be described.

Figure 9A:
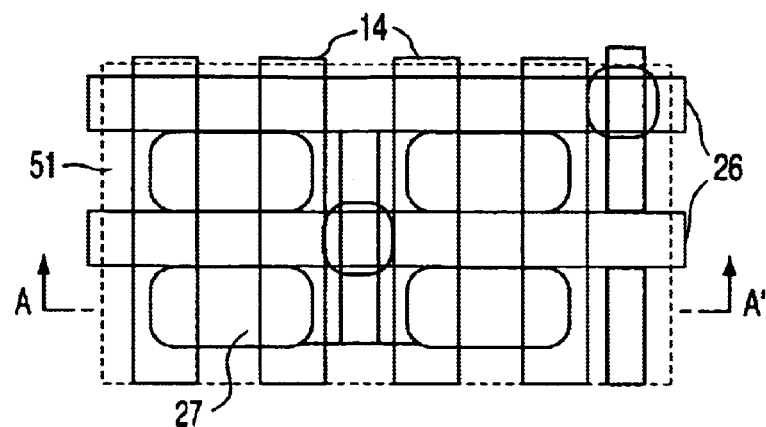
FIGS. 9A to 9C are plan views showing a process for manufacturing the memory cell of the DRAM shown in FIGS. 8A and 8B.
Figure 9B:
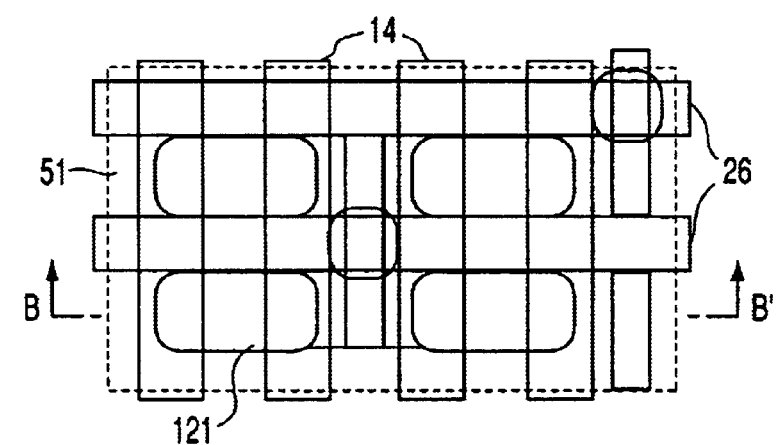
Figure 9C:
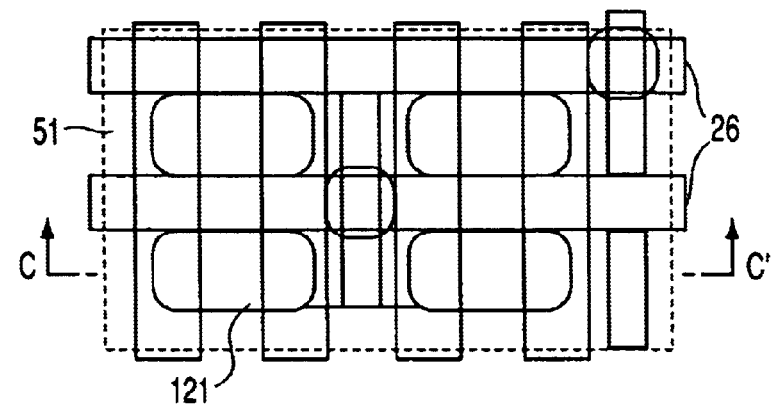

FIGS. 9A to 9C and 10A to 10C are diagrams showing a process for manufacturing the memory cell of the stack-type DRAM shown in FIGS. 8A and 8B. FIGS. 9A to 9c are plan views showing the process for manufacturing the structure shown in FIG. 8A, and FIGS. 10A to 10C are cross-sectional views taken along the lines A–A' to C–C' shown in FIGS. 9A to 9C.

Figure 10A:
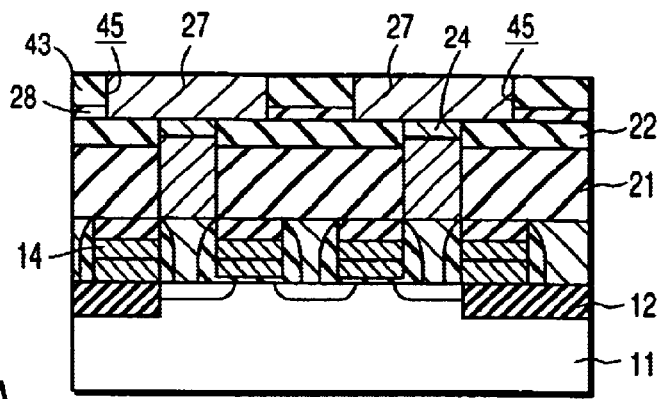
FIGS. 10A to 10C are cross-sectional views taken along the lines A–A' to C–C' shown in FIGS. 9A to 9C.
Figure 10B:
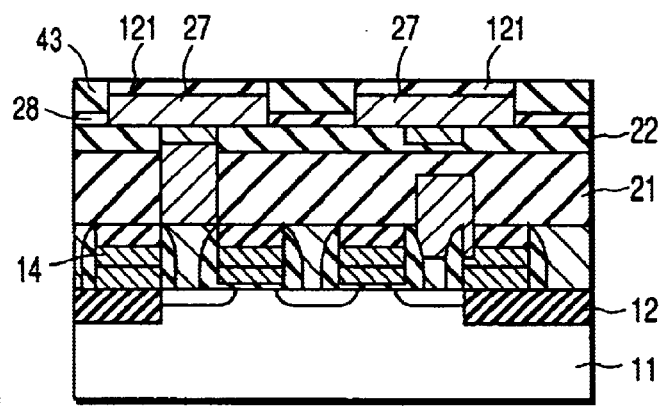

First, the structure shown in FIGS. 9A and 10A is obtained through the same process as in the first embodiment, as described before with reference to FIGS. 2A to 2I and 3A to 3I. Then, as shown in FIGS. 9B and 10B, the portion of the storage node electrode 27 exposed through the surface of the mask layer 43 is etched back (recessed) by about 50 nm by, for example, wet etching. Thereafter, a silicon nitride film is formed on the overall surface by the CVD. Subsequently, the portion of the silicon nitride film which is on the mask layer 43 is removed by the CMP or the like, while the surface is flattened. As a result, an SN cap film 121 is selectively buried in the recess obtained by removing the storage node electrode 27.

Figure 16:
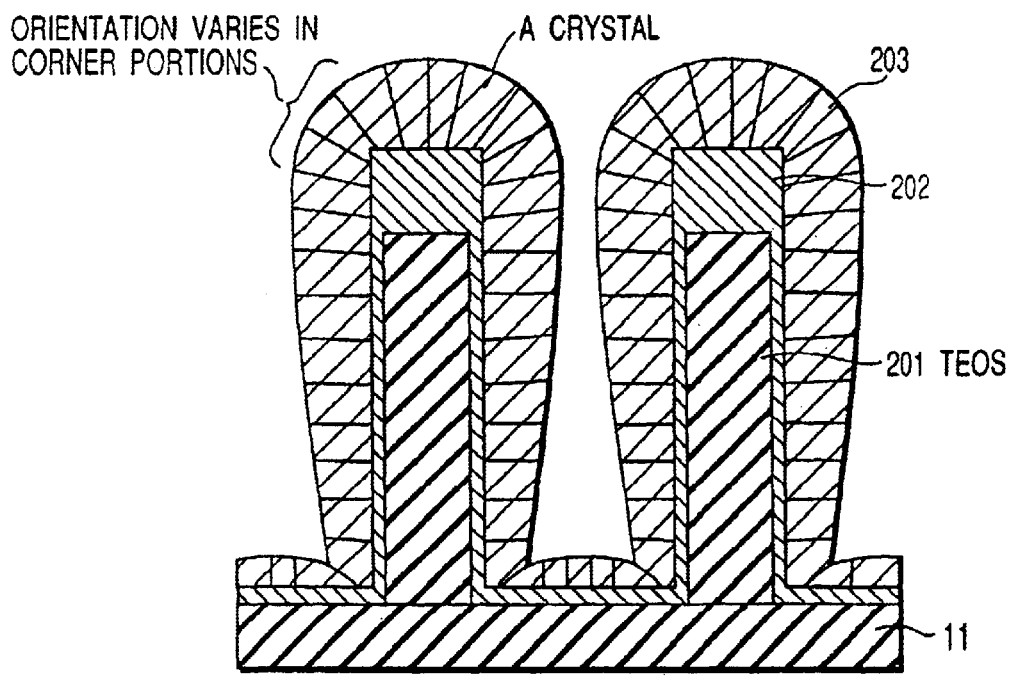
FIG. 16 is a diagram for explaining a problem of the capacitor structure of the DRAM shown in FIG. 15.

The thickness of the SN cap film 121 depends on the thickness of the BST film formed in a subsequent step and the distribution of the crystal orientation (for example, see FIG. 16) of the BST film. It is preferable that the SN cap film 121 be at least 1.0 time as thick as the BST film. If the SN cap film 121 has such a thickness, the crystal orientation of the BST film does not vary in a corner portion on top of the storage node electrode.

Figure 10C:
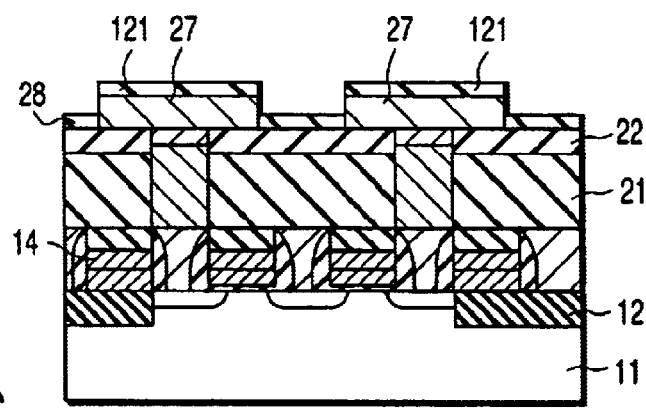

Then, as shown in FIGS. 9C and 10C, a region of the mask layer 43 which should not be removed, for example, the peripheral circuit region, is covered by a resist film, and the mask layer 43 is selectively removed by wet etching solution, for example, $NH_4F$ solution. Thereafter, the resist film is removed. At this time, the wet etching is stopped by the silicon nitride film 28 formed under the mask layer 43. With this process, the surface of the storage node electrode 27 in the memory cell region and the surface of the mask layer 43 in the region other than the memory cell region are aligned at the same level. Thus, the difference in level between the memory cell region and the other region is substantially eliminated, whether the storage node electrode 27 is present or not. In the process of manufacturing a DRAM having a stack structure, a step for reducing the difference in level is very important.

At this time, the SN cap film 121 remains on the top surface of the storage node electrode 27. Therefore, although the corner of the top surface of the storage node electrode 27 has an acute angle, the side of the storage node electrode 27 is flat due to the presence of the SN cap film 121. Thus, the problem of the electric field concentration can be overcome. In other words, the electric field concentration owing to the shape of the storage node electrode 27 can be relieved, so that the influence of the capacitor insulating film on the deterioration of the withstand voltage can be reduced. The side surface of the hole formed by etching the mask layer 43 is transferred to the side surface of the storage node electrode 27. More specifically, the side of the conventional storage node electrode is formed by etching a metal electrode or the like, which is difficult to control. However, according to this embodiment, the etching surface of an oxide film, which is comparatively smooth, is transferred to the side of the storage node electrode. Thus, a smooth side surface of the storage node electrode can be realized. The smooth side of the storage node electrode suppresses the increase in leak current in the capacitor insulating film caused by the electric field concentration due to roughness of the side of the storage node electrode. In addition, since the silicon nitride film 28 is present in the bottom side portion of the storage node electrode 27, it prevents an influence of the bottom corner on the storage node electrode. Thus, only the side of the storage node electrode used as the electrode of the capacitor.

As shown in FIGS. 8A and 8B, a BST film 29 is deposited on the overall surface to a thickness of about 20 nm by, for example, the CVD. If necessary, the BST film is subjected to annealing for crystallization. Further, an $SrRuO_3$ film is deposited on the overall surface to a thickness of about 40 nm by, for example, the CVD method, thereby forming a plate electrode (upper electrode) 30 of the capacitor. Furthermore, for example, a TN film serving as a PL (plate) cap film 31 is deposited to a thickness of about 50 μm by the sputtering or the like. Thereafter, the upper electrode (the plate electrode 30 and the PL cap film 31) is patterned by the conventional lithography and the RIE or the like. At this time, a difference in level occurs between the memory cell region and the other region including no plate electrode, such as the peripheral circuit region.

The plate electrode 30 may be made of a film other than the $SrRuO_3$ film: for example, a conductive film of a precious metal, such as Ru, Pt, Re, Ir, Os, Pd, Rh and Au, an oxide film of the metal, or a perovskite conductive metal oxide film other than the $SrRuO_3$ film. Further, an interlayer insulating film 32, such as a plasma TEOS oxide film, is deposited to a thickness of about 400 nm on the overall surface by the CVD, and the overall surface is flattened again by the CMP method. As a result, the difference in level between the memory cell region and the peripheral circuit region is eliminated.

Subsequently, although not shown in the drawings, a contact hole is opened in a desired region and a metal wire is formed. If necessary, a plurality of contact layers and a plurality of metal wiring layers may be formed. Then, a passivation film is formed and a pad contact is opened, thus completing a DRAM.

In this embodiment, the TiN film or the like is used as the barrier metal layer between the W plug 23 and the storage node electrode 27. However, it is important that a conductive film be buried in part of the trench of the W plug 23. The conductive film may be made of a laminated film such as a TiN/Ti film, a metal film such as $WSi_2$ film, Nb film and Ti film, and a compound, for example, a silicide film of the aforementioned metal or a nitride film thereof (e.g., a WN film). The characteristics required for the barrier metal material are a reaction barrier characteristic between the metal plug material (for example, W film or TiN film) and the storage node electrode material ($SrRuO_3$ film or Ru film), and an oxidation resistance characteristic. Any material other than those indicated above can be used as a barrier metal layer forming material, so long as it has the above characteristics.

The capacitor cell of this embodiment provides the following effects and advantages owing to the storage node electrode structure described above.

1. Since the side of the storage node electrode 27 and the side of the SN cap film 121 are continuous to each other, concentration of the electric field due to an acute corner formed between the side and the top surface of the storage node electrode is prevented. Therefore, leak current in the capacitor insulating film is reduced.

2. Since the top surface of the storage node electrode is covered by the insulating film, when a capacitor insulating film is formed by the chemical-vapor deposition (CVD), the CVD film cannot be thicker on the top surface of the storage node electrode than on the side thereof. Therefore, the coverage of the capacitor insulating film (the uniformity in thickness of the film on the side of the storage node electrode) is improved, so that the capacitor insulating film can be thinner. Thus, the capacitance can be increased.

In this embodiment, two layers of the (Ba, Sr)TiO$_3$ film and the cap film are formed as the insulating film between the upper surface of the storage node electrode and the plate electrode. Since the insulating film on the top surface of the storage node electrode is thicker than that on the side thereof, there may be a problem of reduction in capacitance. However, since at least 90% of the capacitance of the stack-type capacitor is obtained from the side of the capacitor and the capacitance of the top surface is a little, the capacitance of the overall structure is increased by suppressing the electric field concentration and the leak current by the cap film.

3. Since the orientation of the BST film is not varied but uniform on the side of the storage node electrode, the uniformity in characteristics (leak current, relative dielectric constant, etc.) of the capacitor insulating film on that portion is improved. As a result, the yield of the DRAM elements is improved.

[Sixth Embodiment]

Figure 11A:
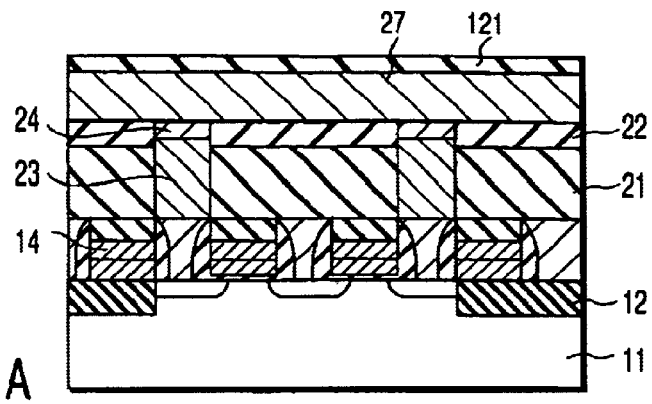
FIGS. 11A and 11B are cross-sectional views showing a process for manufacturing a memory cell of a stack-type DRAM according to a sixth embodiment of the present invention.
Figure 11B:
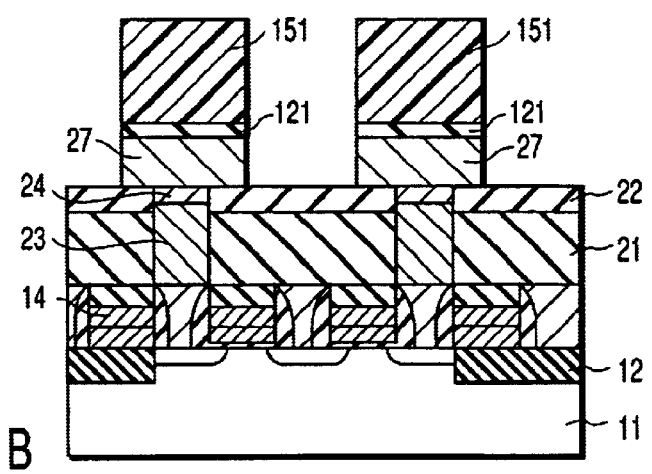

FIGS. 11A and 11B are cross-sectional views showing a process for manufacturing a memory cell of a stack-type DRAM according to a sixth embodiment of the present invention. The cross sections are taken along a line corresponding to the line A–A' in FIG. 1A. This embodiment is different from the fifth embodiment in method for forming a storage node electrode.

After the step of the first embodiment described with reference to FIGS. 2F and 3F, a storage node electrode material 27 made of SrRuO$_3$ and an SN cap film material 121 are deposited on the overall surface by, for example, the sputtering or the CVD. Subsequently, as shown in FIG. 11B, after a resist film 151 for a storage node electrode pattern is formed, the SN cap film material 121 and the storage node electrode material 27 are etched by the RIE, the CDE or the wet etching, thereby forming the SN cap film 121 and the storage node electrode 27. With this process, the SN cap film 121 and the storage node electrode 27 are processed into the same shape in a self-aligning manner. Thereafter, the resist film 151 is removed, and then a BST film and a plate electrode are successively formed.

In the fifth embodiment, the storage node electrode material is buried in the hole pattern form the storage node electrode. In the sixth embodiment, the storage node electrode material is processed by using a Levenson mask. In this embodiment also, the field concentration at a corner of the storage node electrode can be prevented.

[Seventh Embodiment]

Figure 12:
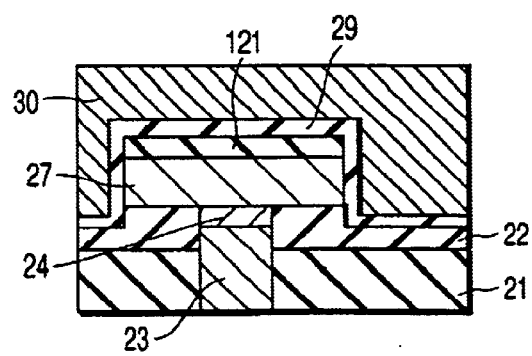
FIG. 12 is a schematic cross-sectional view showing a structure including a storage node electrode of a memory cell of a stack-type DRAM according to a seventh embodiment of the present invention.

FIG. 12 is a schematic cross-sectional view showing a structure including a storage node electrode of a memory cell of a stack-type DRAM according to a seventh embodiment of the present invention. This embodiment is different from the fifth and sixth embodiments in structure of the storage node electrode.

According to the fifth and sixth embodiments, since the SN cap film is formed on the top surface of the storage node electrode, the electric field concentration in an upper corner of the storage node electrode is prevented. However, there may be a problem of an increase in leak current in the BST film due to a change in crystal orientation of the BST film in a bottom corner of the storage node electrode.

To solve the problem, the TEOS oxide film 22 is removed along the side of the storage node electrode 27, so that the side of the storage node electrode 27 is sandwiched between the SN cap film 121 and the TEOS oxide film 22 and completely flattened.

The above structure is produced as follows. After the storage node electrode 27 is processed, the TEOS oxide film 22 is etched by the RIE or the like to a depth corresponding to, for example, about 1 to 3 times the thickness of the BST film 29.

With this structure, the side of the storage node electrode 27 is sandwiched between the insulating films from above and below, and has a continuous flat surface. Therefore, when the BST film is crystallized, the crystal orientation can be uniform, so that the leak current due to the variation of the crystal orientation can be considerably reduced.

[Eighth Embodiment]

Figure 13:
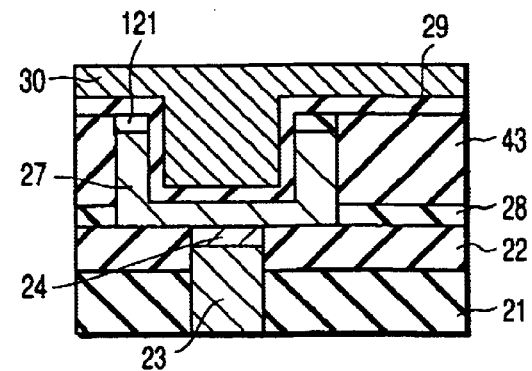
FIG. 13 is a schematic cross-sectional view showing a structure including a storage node electrode of a memory cell of a stack-type DRAM according to an eighth embodiment of the present invention.

FIG. 13 is a schematic cross-sectional view showing a structure including a storage node electrode of a memory cell of a stack-type DRAM according to an eighth embodiment of the present invention.

In the following description of the embodiment, a method for forming an SN cap film of a storage node electrode structure of concave type is proposed.

FIGS. 14A to 14E are cross-sectional views showing a process for manufacturing the stack-type DRAM according to the eighth embodiment.

Figure 14A:
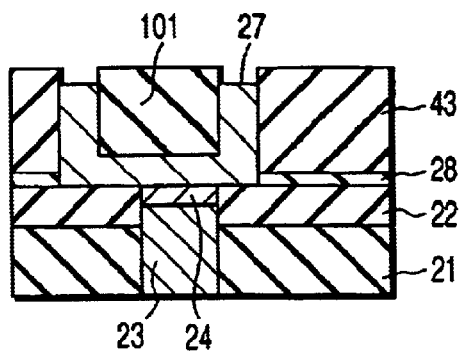
FIGS. 14A to 14E are cross-sectional views showing a process for manufacturing the stack-type DRAM according to the eighth embodiment of the present invention.
Figure 14D:
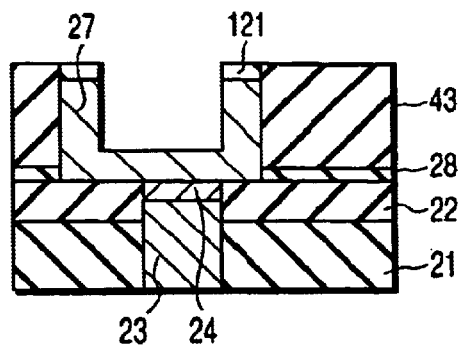
Figure 14B:
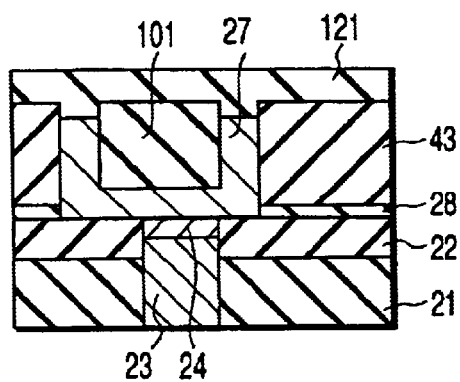
Figure 14E:
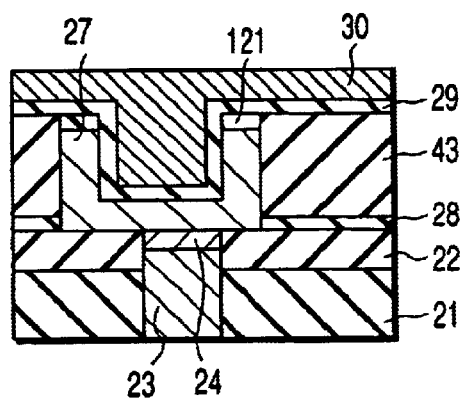
Figure 14C:
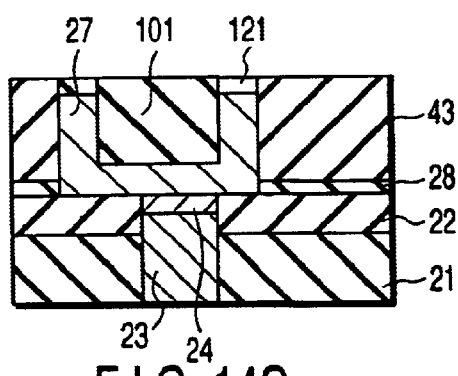
Figure 15:
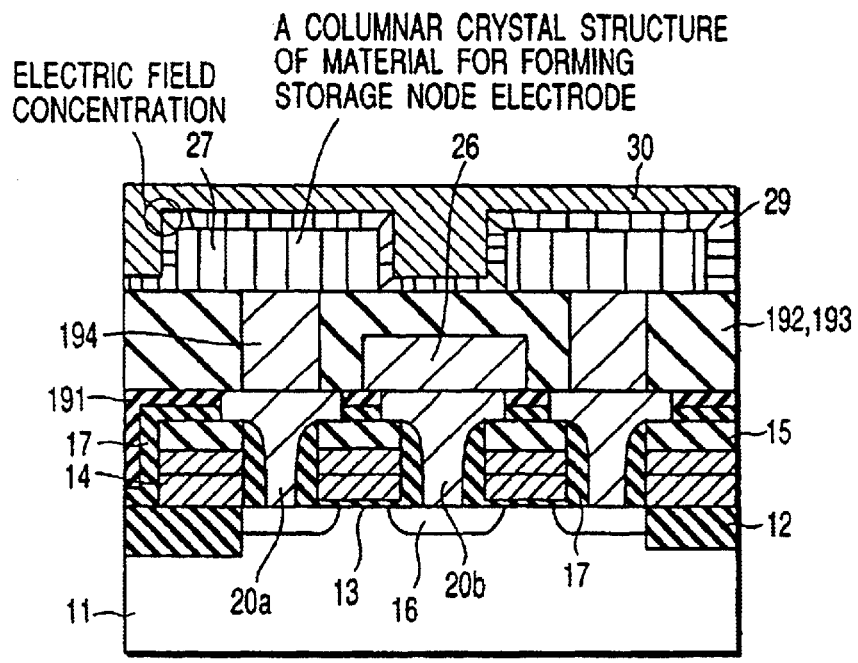
FIG. 15 is a diagram showing a capacitor structure of the conventional stack-type DRAM.

After the step described before with reference to FIG. 6C, the storage node electrode material 27 is selectively etched back (recessed) by, for example, the soft etching, so that the upper surface thereof is etched back by about 40 nm, as shown in FIG. 14A. Then, the silicon nitride film 121 or the like is deposited on the overall surface by the CVD (FIG. 14B), and thereafter, the SN cap film 121 is selectively formed only on the region of the storage node electrode material to the same level as the mask layer 43 by the CMP (FIG. 14C). Thereafter, the SOG film is removed (FIG. 14D), and the BST film 29 and the plate electrode 30 are formed (FIG. 14E). Thus, a capacitor is completed.

With the above structure, the side in an upper portion of the storage node electrode of the concave type is flattened by the SN cap film. As a result, the influence of the electric field concentration is reduced.

The present invention is not limited to the above embodiments. In the above embodiments, the BST film is used as the capacitor insulating film. However, the present invention can be applied to an insulating film having a high dielectric constant, in which the leak current characteristic or crystallinity of the film is influenced by the base, i.e., the storage node electrode. Therefore, the capacitor insulating film may be another film, for example, Pb (Zr, Ti)O$_3$, SrTiO$_3$ or Ta$_2$O$_5$ film.

The present invention can be variously modified within the scope of the gist of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a conductive plug formed on the semiconductor substrate;

a lower electrode formed in contact with the conductive plug and having a side and upper surface, a surface area of the side being larger than a surface area of the upper surface, the lower electrode comprising a plurality of crystal grains, the crystal grains containing a metallic element;

a capacitor insulating film formed on a side of the lower electrode; and an upper electrode formed above the lower electrode via the capacitor insulating film, the capacitor insulating film being formed above a top surface of the lower electrode via a second insulating film different from the capacitor insulating film, and a grain boundary between adjacent two of said plurality of crystal grains of the lower electrode being substantially perpendicular to an interface between the lower electrode and the capacitor insulating film.

* * * * *